United States Patent
Katayama

(10) Patent No.: US 10,601,444 B2
(45) Date of Patent: Mar. 24, 2020

(54) INFORMATION PROCESSING APPARATUS, INFORMATION PROCESSING METHOD, AND RECORDING MEDIUM STORING PROGRAM

(71) Applicant: FUJITSU LIMITED, Kawasaki-shi, Kanagawa (JP)

(72) Inventor: Kentaro Katayama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/296,408

(22) Filed: Mar. 8, 2019

(65) Prior Publication Data

US 2019/0319635 A1 Oct. 17, 2019

(30) Foreign Application Priority Data

Apr. 13, 2018 (JP) .................. 2018-077621

(51) Int. Cl.
| | |
|---|---|
| *H03M 7/34* | (2006.01) |
| *H03M 7/38* | (2006.01) |
| *H03M 7/30* | (2006.01) |
| *H04L 29/06* | (2006.01) |
| *G06F 9/54* | (2006.01) |
| *G06F 9/38* | (2018.01) |

(52) U.S. Cl.
CPC .......... *H03M 7/6082* (2013.01); *H04L 69/04* (2013.01); *G06F 9/3877* (2013.01); *G06F 9/542* (2013.01)

(58) Field of Classification Search
CPC .................. H03M 7/6082; H03M 7/6088
USPC .......................... 341/50, 51
See application file for complete search history.

(56) References Cited

U.S. PATENT DOCUMENTS

| | | | |
|---|---|---|---|
| 2015/0270849 A1* | 9/2015 | Fallon ................. | G06T 9/00 375/240.01 |
| 2017/0024278 A1* | 1/2017 | Twitto ................. | G06F 11/1068 |
| 2017/0075844 A1 | 3/2017 | Kobayashi et al. | |
| 2018/0191372 A1* | 7/2018 | Marlow .............. | H03M 7/3084 |

FOREIGN PATENT DOCUMENTS

| | | |
|---|---|---|
| JP | 04-359315 | 12/1992 |
| JP | 2005-301607 | 10/2005 |
| JP | 2017-058858 | 3/2017 |

* cited by examiner

*Primary Examiner* — Peguy Jean Pierre
(74) *Attorney, Agent, or Firm* — Fujitsu Patent Center

(57) ABSTRACT

An information processing apparatus includes: a processor; and a processing circuit coupled to the processor, wherein the processing circuit is configured to: generate compressed data by compressing send data; and determine whether to transmit the compressed data or the send data before the compression to a network, based on a size of the compressed data, and wherein the processor is configured to transmit the compressed data or the send data before the compression to the network, based on a result of the determination.

15 Claims, 20 Drawing Sheets

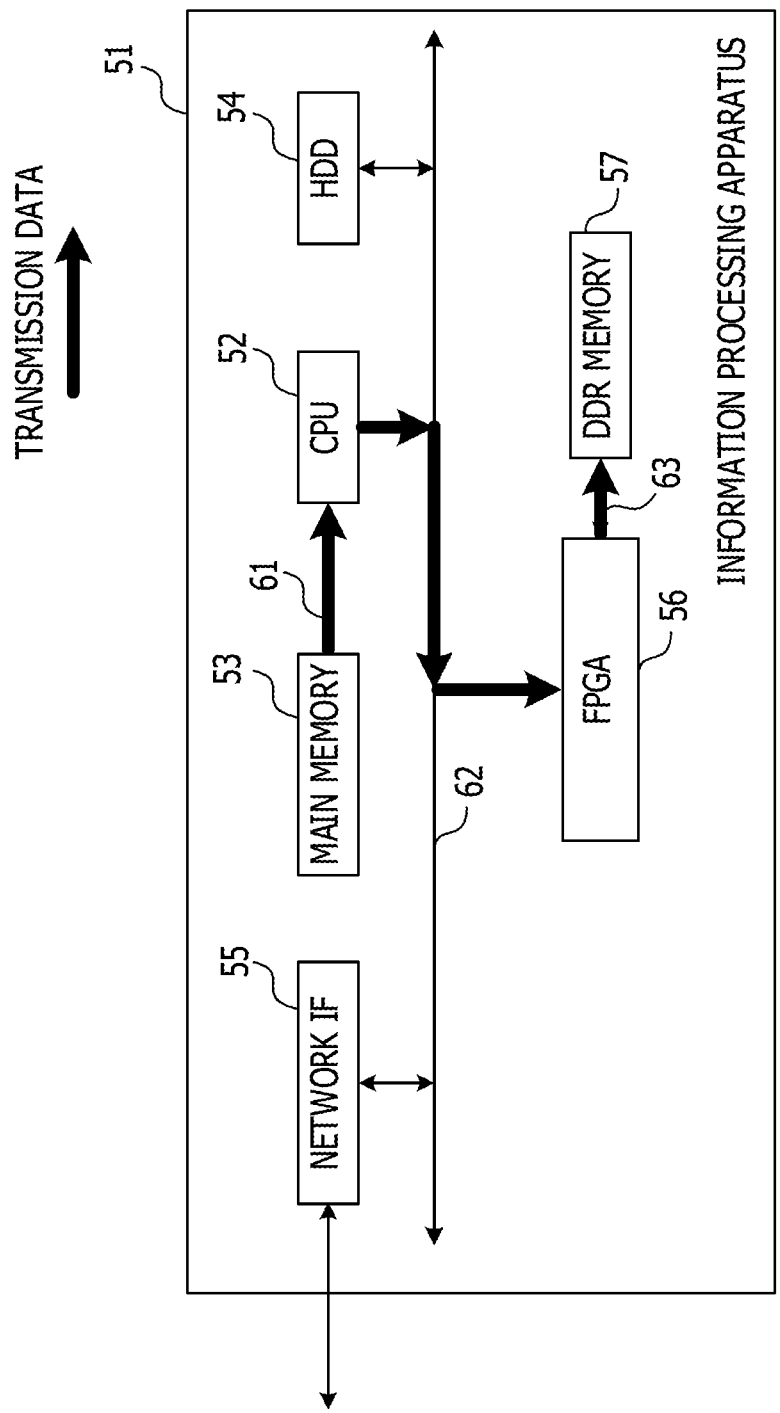

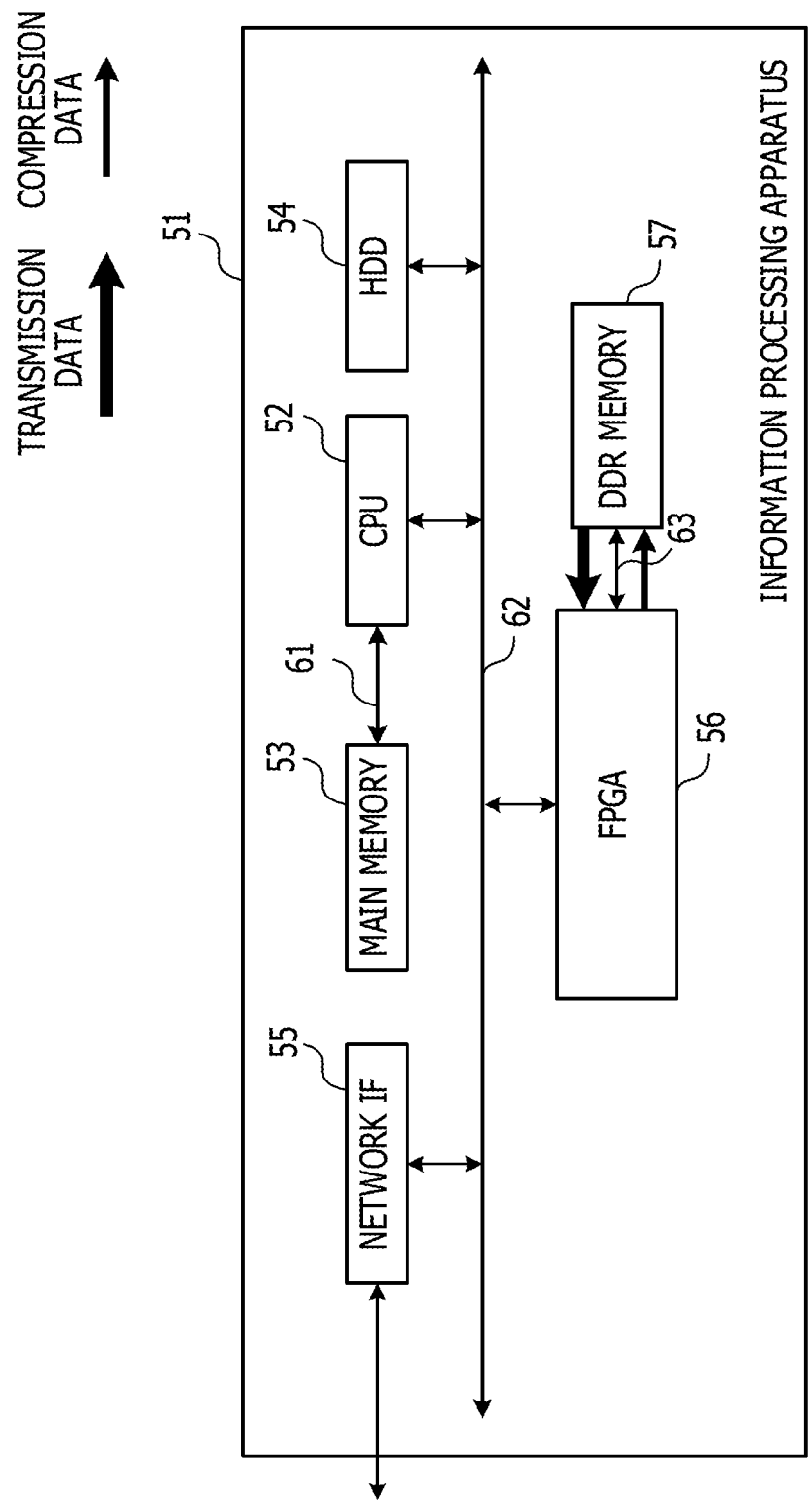

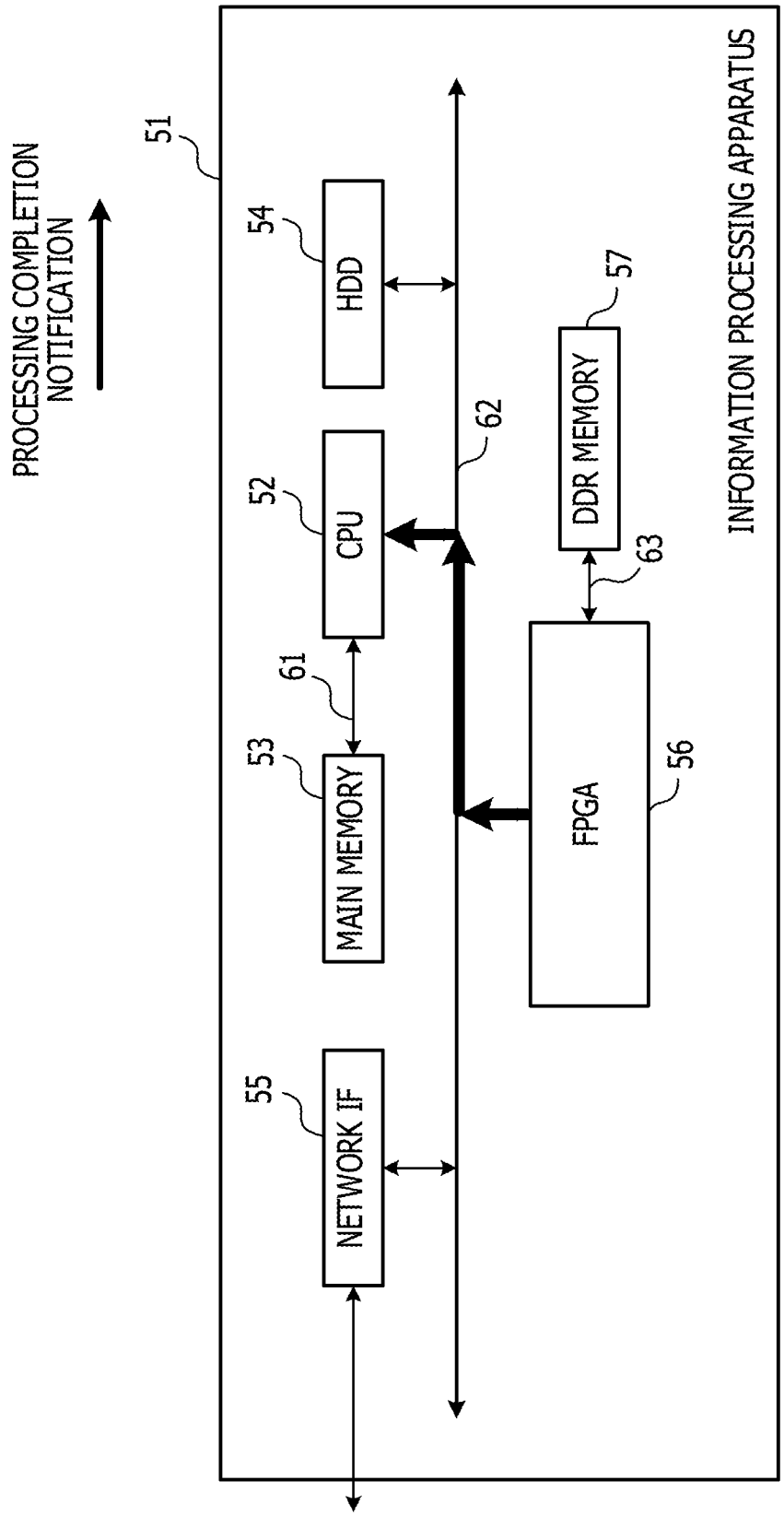

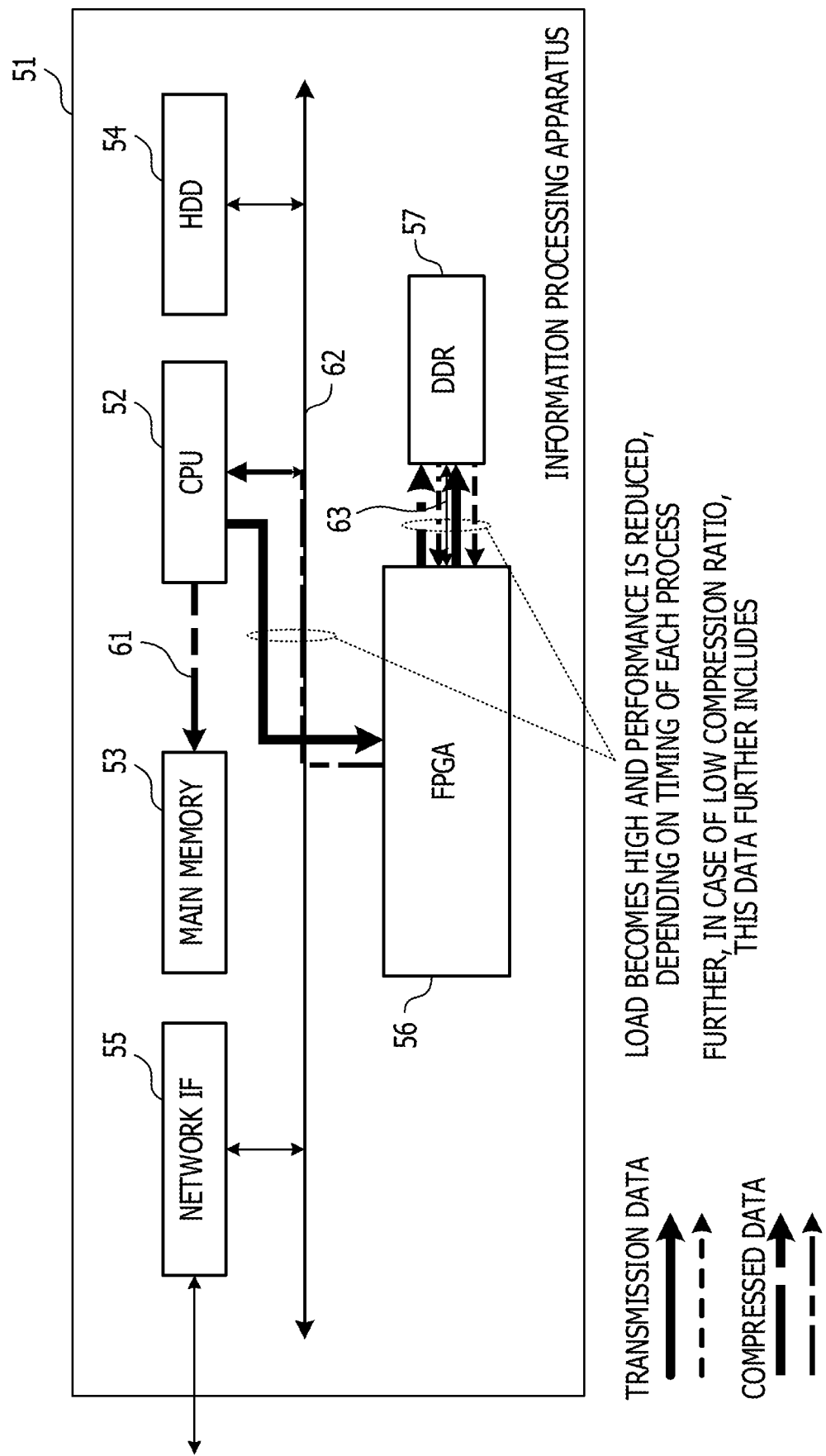

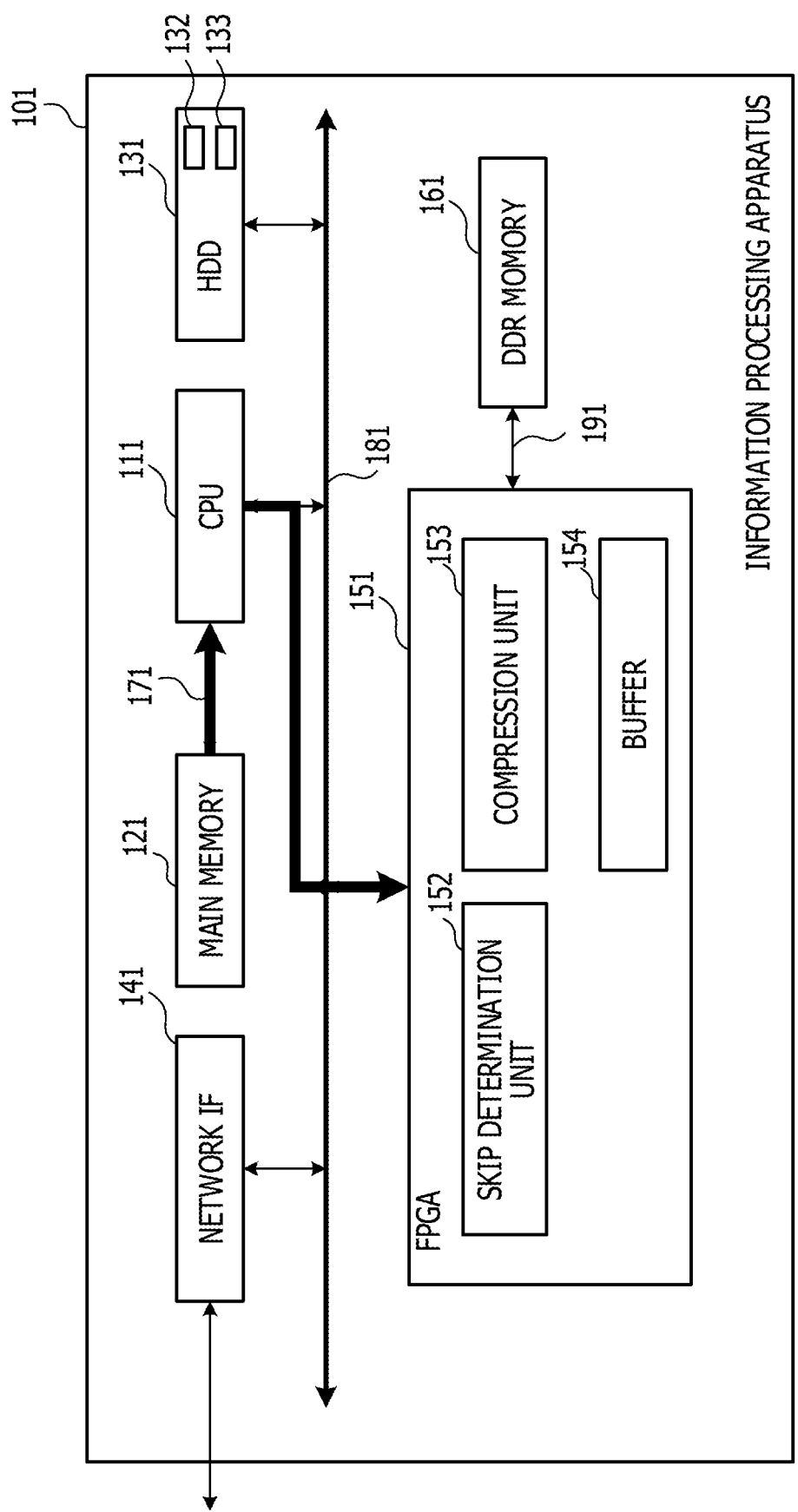

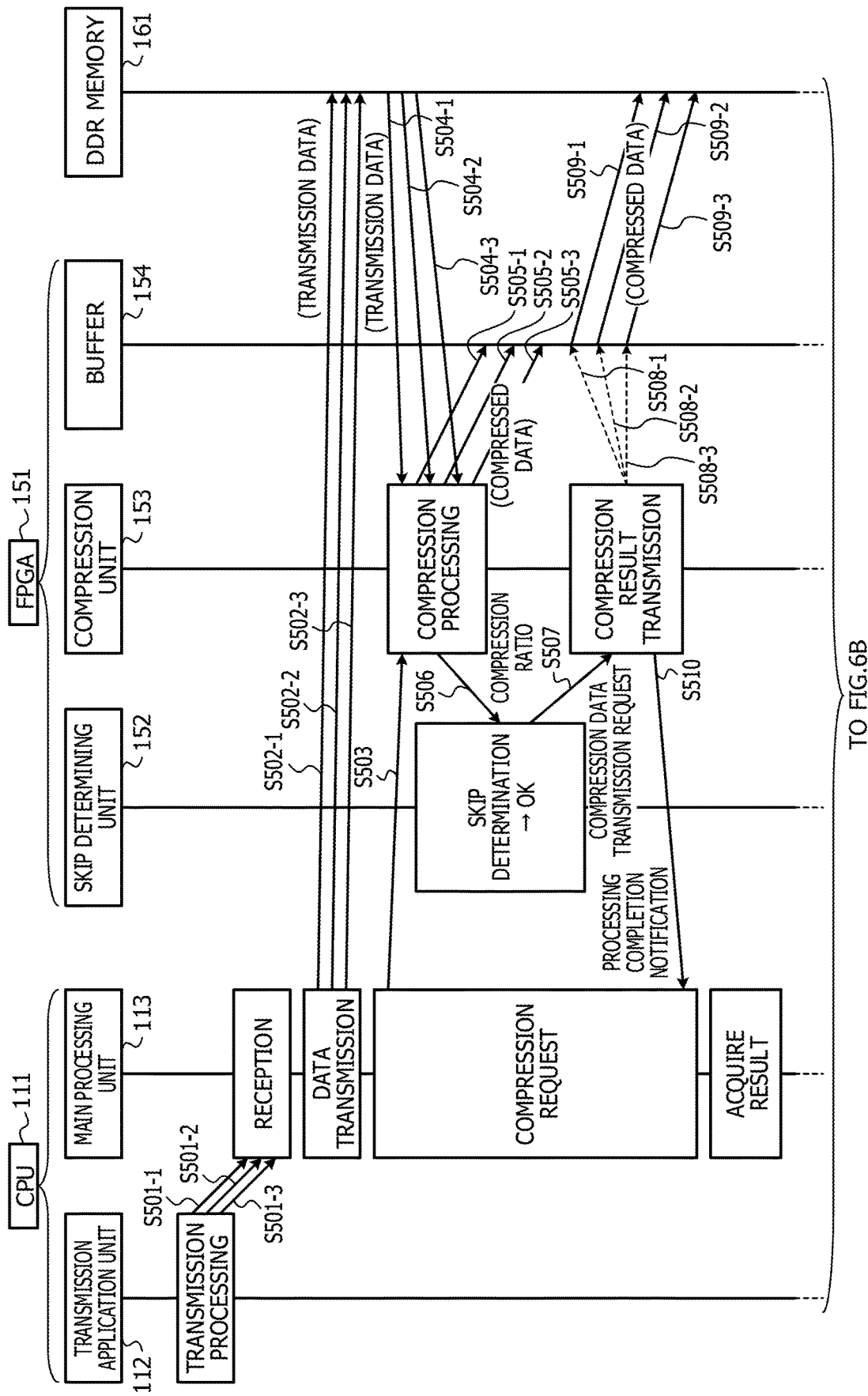

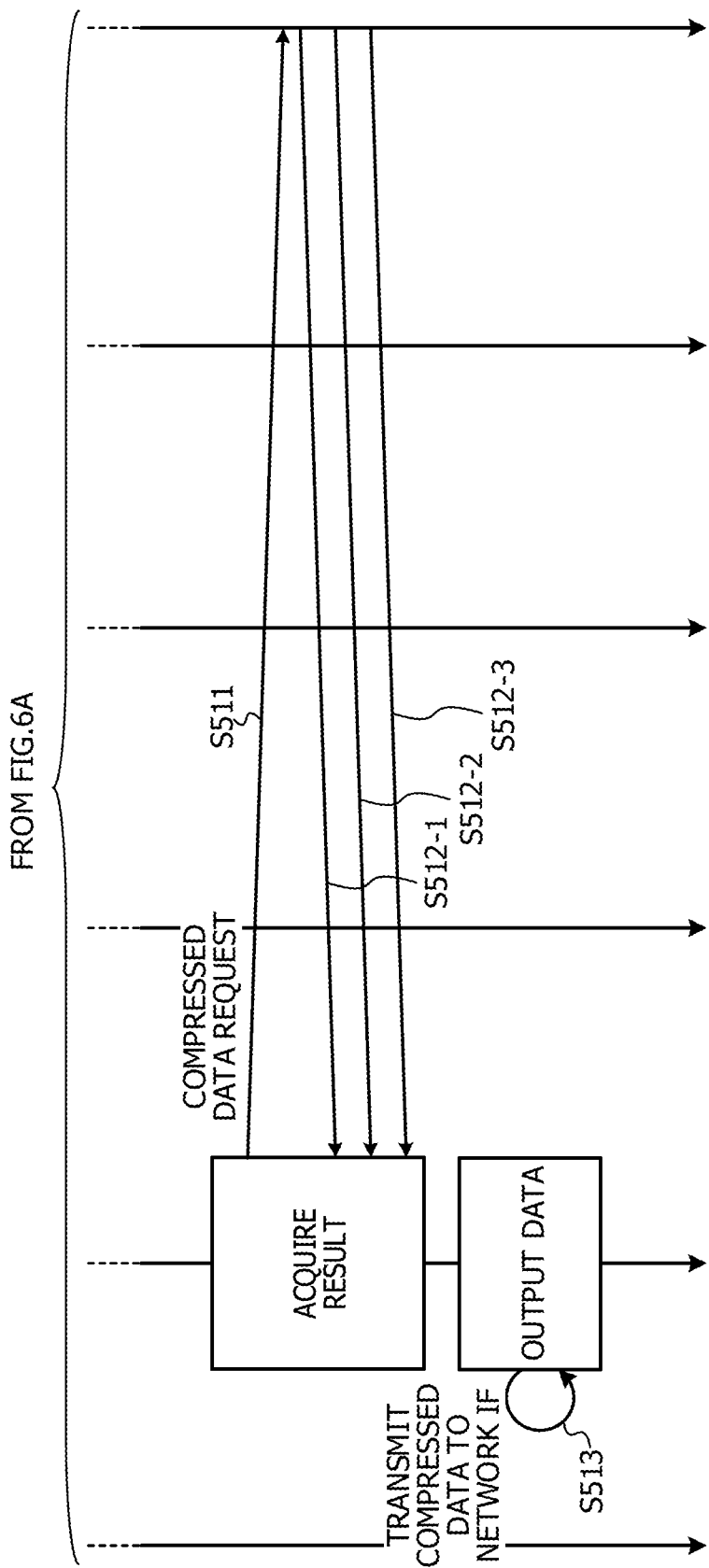

INFORMATION PROCESSING APPARATUS, INFORMATION PROCESSING METHOD, AND RECORDING MEDIUM STORING PROGRAM

CROSS-REFERENCE TO RELATED APPLICATION

This application is based upon and claims the benefit of priority of the prior Japanese Patent Application No. 2018-77621, filed on Apr. 13, 2018, the entire contents of which are incorporated herein by reference.

FIELD

An embodiment relates to an information processing apparatus, an information processing method, and a recording medium storing a program.

BACKGROUND

Processing unsuitable for software executed by a central processing unit (CPU) is performed by a hardware (HW) accelerator such as a graphic processing unit (GPU) and a field-programmable gate array (FPGA), so that the processing is speeded up.

Related technologies are disclosed in Japanese Laid-open Patent Publication No. 2017-58858, Japanese Laid-open Patent Publication No. 2005-301607, and Japanese Laid-open Patent Publication No. 04-359315.

SUMMARY

According to an aspect of the embodiments, an information processing apparatus includes: a processor; and a processing circuit coupled to the processor, wherein the processing circuit is configured to: generate compressed data by compressing send data; and determine whether to transmit the compressed data or the send data before the compression to a network, based on a size of the compressed data, and wherein the processor is configured to transmit the compressed data or the send data before the compression to the network, based on a result of the determination.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2B is a diagram for illustrating the WAN acceleration technology by the information processing apparatus according to a comparative example;

FIG. 2C is a diagram for illustrating the WAN acceleration technology by the information processing apparatus according to the comparative example;

FIG. 2D is a diagram for illustrating the WAN acceleration technology by the information processing apparatus according to the comparative example;

FIG. 3 is a diagram for illustrating a problem according to the comparative example;

FIG. 5B is a diagram for illustrating the transmission processing according to the embodiment;

FIGS. 6A and 6B are a sequence diagram illustrating the transmission processing when compressed data is transmitted according to the embodiment;

DESCRIPTION OF EMBODIMENT

For example, an HW accelerator is used in various fields such as web search and a cloud service.

For example, the following two approaches are roughly provided as a wide area network (WAN) acceleration technology for band-widening a WAN.

(1) Transport optimization: a transmission control protocol (TCP)/user datagram protocol (UDP) is improved, and even when there is delay or packet loss, a WAN band may be effectively used.

(2) Data optimization: send data is compressed before being transmitted to the WAN, so that the size of data sent to the WAN is reduced, and an effective bandwidth is improved.

Data optimization has a large computational amount, and when the data optimization is executed by the CPU, the large computational amount may become a bottleneck. Therefore, the send data is compressed by an FPGA, so that speed up is achieved.

Figure 1:
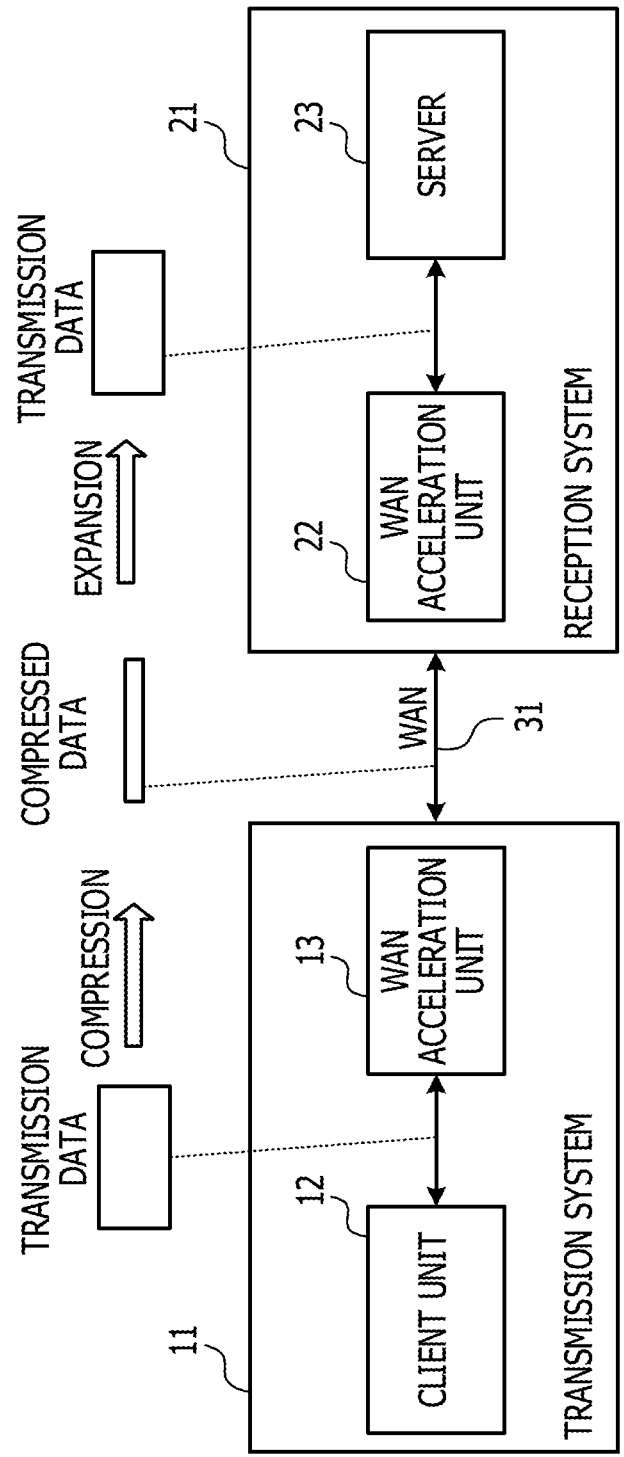
FIG. 1 is a diagram for illustrating an example of a WAN acceleration technology by data optimization.

FIG. 1 is a diagram for illustrating an example of a WAN acceleration technology by the data optimization. An example where the send data is transmitted from a client 12 of a transmission system 11 to a server 23 of a reception system 21 will be described in FIG. 1.

The transmission system 11 has the client 12 and a WAN acceleration unit 13, and the reception system 21 has a WAN acceleration unit 22 and the server 23. The WAN acceleration unit 13 and the WAN acceleration unit 22 are coupled to each other via a WAN 31.

When the send data is transmitted from the client 12 to the server 23, the client 12 transmits the send data to the WAN acceleration unit 13, and the WAN acceleration unit 13 generates compressed data by compressing the received send data. The WAN acceleration unit 13 transmits the compressed data to the WAN acceleration unit 22 via the WAN 31.

The WAN acceleration unit 22 expands the received compressed data and restores the send data. The WAN acceleration unit 22 transmits the send data to the server 23.

In this way, in the WAN acceleration technology by the data optimization, the compressed data is transmitted to the WAN, so that a bandwidth consumption of the WAN may be reduced.

For example, a problem such as a decrease in a throughput due to caching for a storage device when the information processing apparatus is busy may be solved.

For example, the performance of the information processing apparatus may be deteriorated when an information processing apparatus compresses the send data using the FPGA, and a load on the bus between the CPU and the FPGA is too large. For example, when a compression ratio of the data is low, a load of the bus may increase, and the performance is degraded.

For example, deterioration of the performance of the information processing apparatus may be prevented on the data transfer.

Hereinafter, an embodiment will be described with reference to the drawings.

First, details of a general WAN acceleration technology and a problem on the comparative example will be described.

FIGS. 2A to 2F are diagrams for illustrating the WAN acceleration technology by an information processing apparatus according to a comparative example.

Figure 2A:
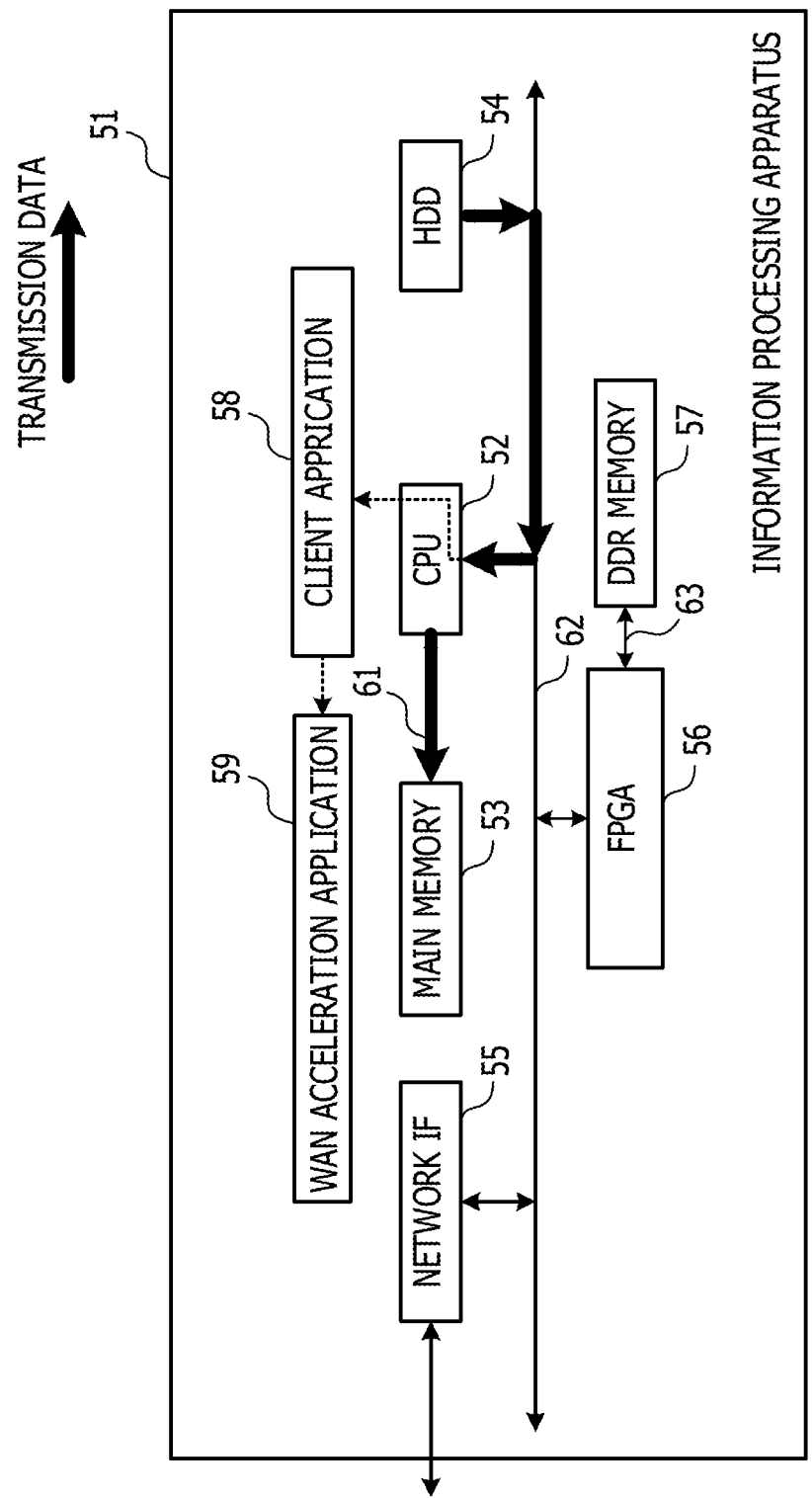
FIG. 2A is a diagram for illustrating the WAN acceleration technology by an information processing apparatus according to a comparative example.

FIG. 2A: An information processing apparatus 51 includes a CPU 52, a main memory 53, a hard disk drive (HDD) 54, a network interface (IF) 55, an FPGA 56, and a double-data-rate synchronous (DDR) memory 57.

The CPU 52 is coupled to the main memory 53 via a memory bus 61. The CPU 52 executes a client application 58 and a WAN acceleration application 59 with the main memory 53. The CPU 52, the HDD 54, the network IF 55, and the FPGA 56 are coupled to each other via the bus 62 (for example, a PCI Express bus). The FPGA 56 is coupled to the DDR memory 57 via the bus 63. The network IF 55 is coupled to the WAN. Furthermore, it is assumed that the send data is stored in the HDD 131.

The client application 58 reads the send data from the HDD 54, and transmits the send data and a transmission request of the send data to the WAN acceleration application 59. The WAN acceleration application 59 transmits the send data to the main memory 53, and stores the send data in the main memory 53.

FIG. 2B: The CPU 52 executing the WAN acceleration application 59 transmits the send data to the DDR memory 57. In detail, the CPU 52 transmits the send data to the FPGA 56, and the FPGA 56 stores the send data in the DDR memory 57.

FIG. 2C: The FPGA 56 reads the send data from the DDR memory 57, and generates the compressed data by compressing the send data. The FPGA 56 stores the compressed data in the DDR memory 57.

FIG. 2D: The FPGA 56 notifies the completion of processing to the CPU 52.

Figure 2E:
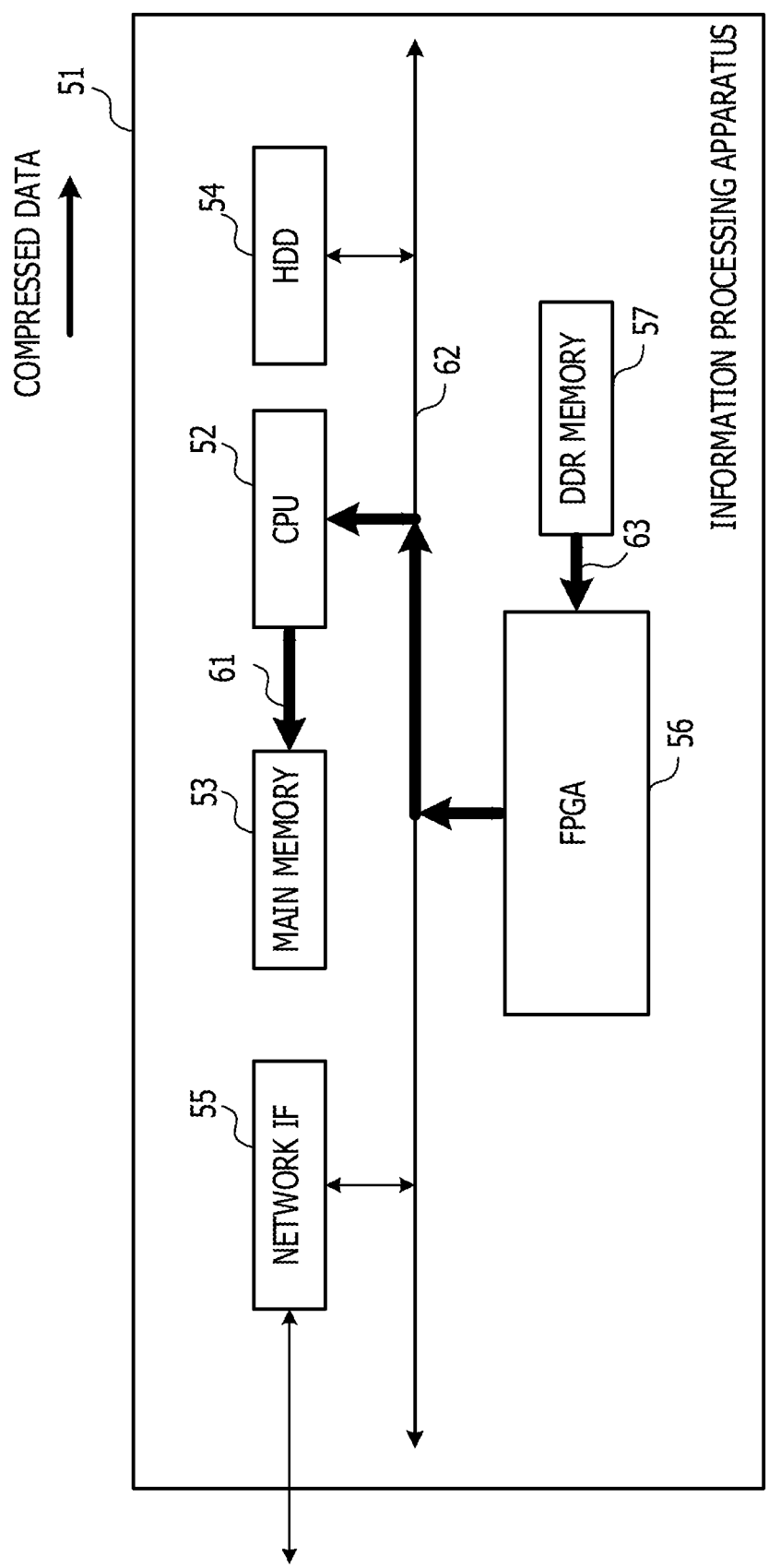
FIG. 2E is a diagram for illustrating the WAN acceleration technology by the information processing apparatus according to the comparative example.

FIG. 2E: The CPU 52 executing the WAN acceleration application 59 reads the compressed data from the DDR memory 57, and stores the compressed data in the main memory 53.

Figure 2F:
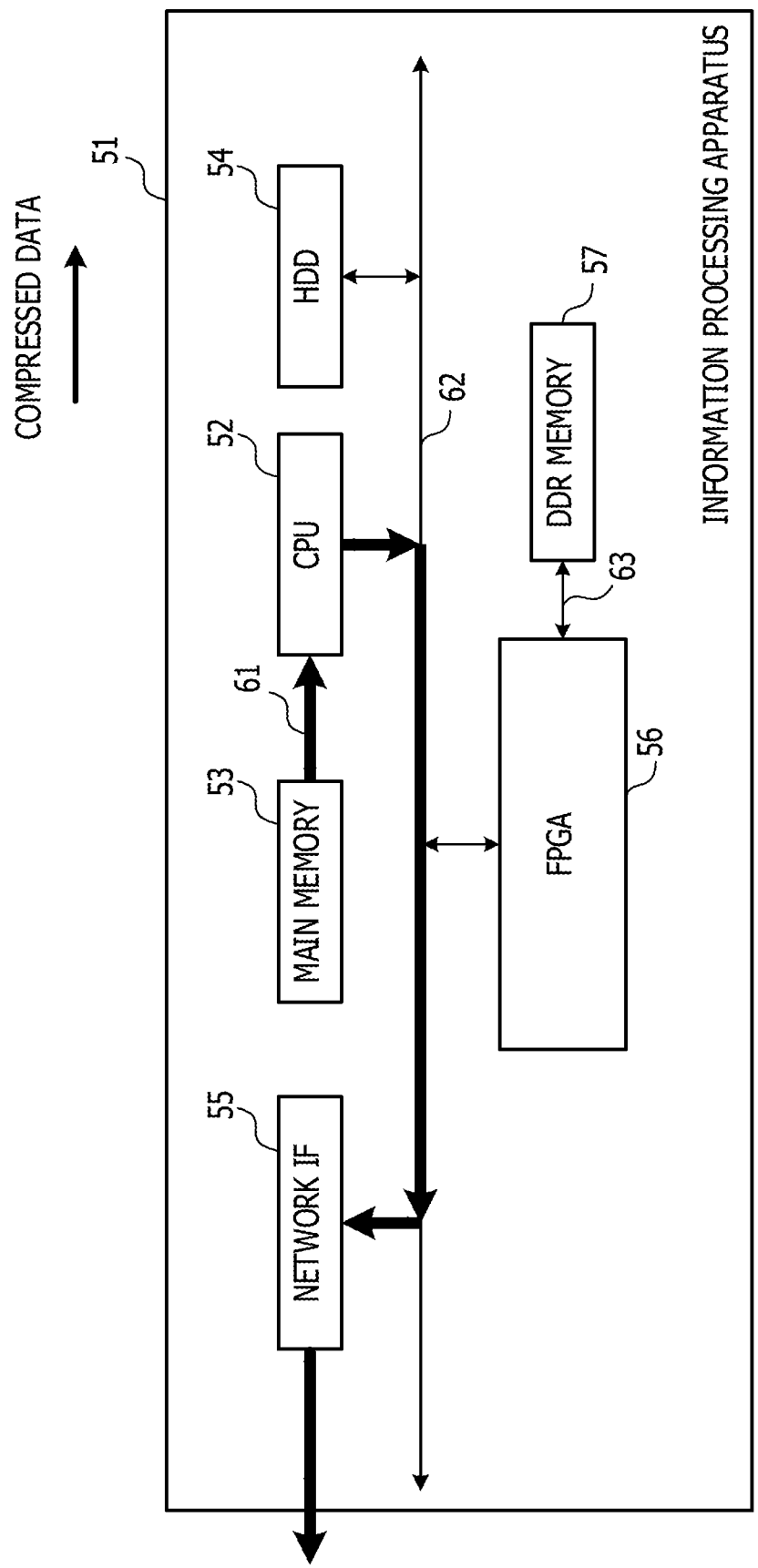
FIG. 2F is a diagram for illustrating the WAN acceleration technology by the information processing apparatus according to the comparative example.

FIG. 2F: The CPU 52 executing the WAN acceleration application 59 reads the compressed data from the main memory 53, and transmits the compressed data to the network IF 55. The network IF 55 transmits the compressed data to a destination via the WAN.

FIG. 3 is a diagram for illustrating a problem according to the comparative example.

In the information processing apparatus 51, when the bus 63 between the FPGA 56 and the DDR memory 57 or the bus 62 between the CPU 52 and the FPGA 56 is congested, performance is degraded. When the FPGA 56 performs highly parallel processing, the loads on the buses 62 and 63 may temporarily increase due to fluctuation of an access timing of each arithmetic unit in the FPGA 56. Accordingly, performance of the information processing apparatus 51 may be degraded.

Furthermore, the compression ratio changes depending on the send data. Since the size of the compressed data increases when the compression ratio is low, the loads of the buses 62 and 63 increase, which may lead to further performance degradation.

Figure 4:
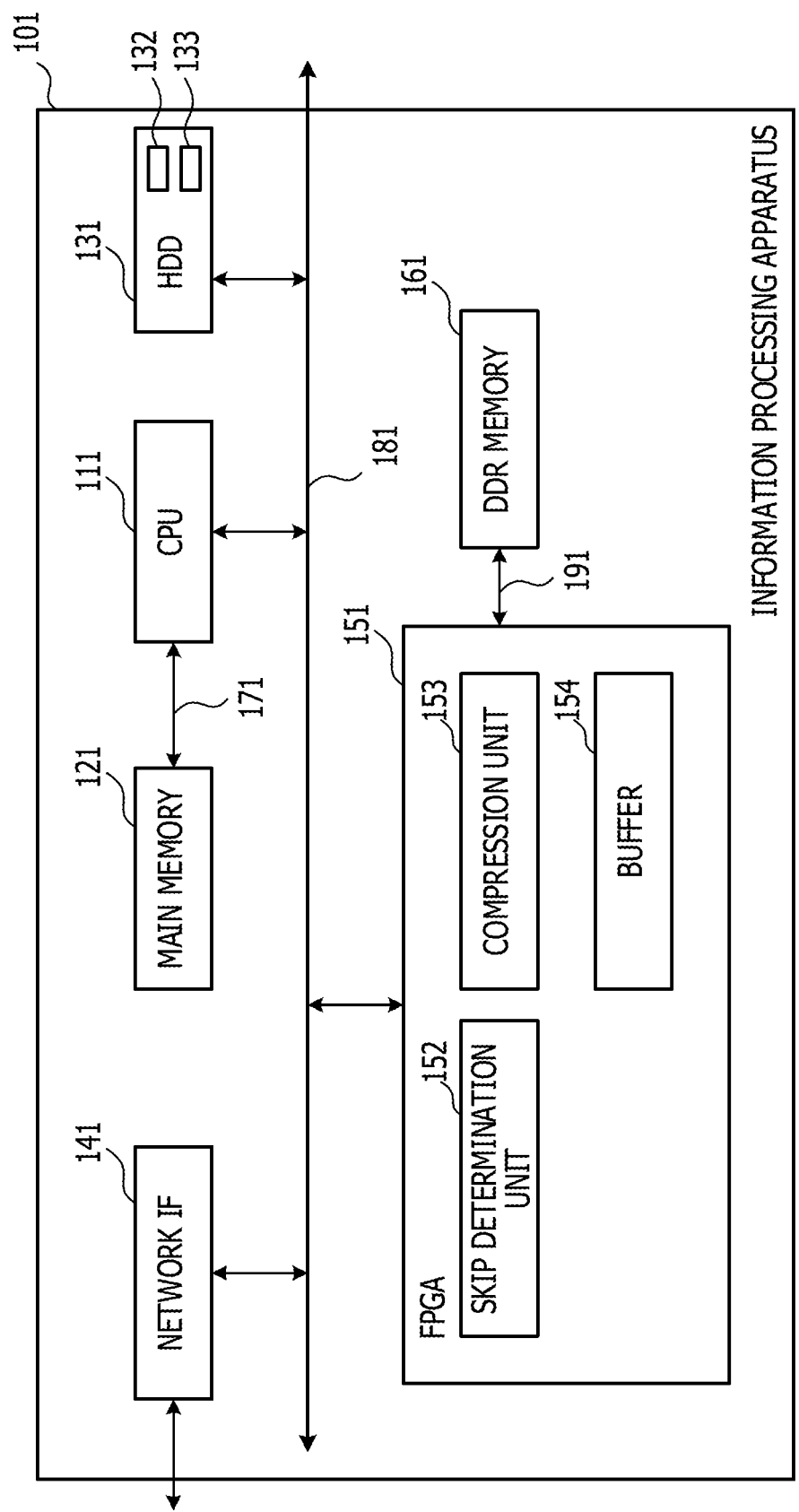
FIG. 4 is a diagram illustrating an information processing apparatus according to an embodiment.

FIG. 4 is a diagram illustrating an information processing apparatus according to the embodiment.

An information processing apparatus 101 includes a CPU 111, a main memory 121, a HDD 131, a network IF 141, an FPGA 151, and a DDR memory 161. The information processing apparatus 101 is, for example, a computer such as a server.

The CPU 111 is coupled to the main memory 121 through a memory bus 171. The CPU 111, the HDD 131, the network IF 141, and the FPGA 151 are coupled to each other through a bus 181. The CPU 111 is an example of a processing unit.

The FPGA 151 has a skip determining unit 152, a compression unit 153, and a buffer 154. The FPGA 151 is coupled to the DDR memory 161 through a bus 191. The FPGA 151, which is a reconfigurable integrated circuit, is an example of a processing circuit. The skip determining unit 152 is an example of a determination unit. The skip determining unit 152 and the compression unit 153 are an example of a calculation unit.

The HDD 131 stores a program, data, and the like used in the information processing apparatus 101. The HDD 131 stores a client application 132 and a WAN acceleration application 133. The client application 132 is a program that requests transmission of the send data, and the WAN acceleration application 133 is a program that transmits the send data or the compressed data to a destination device through the network IF 141 in response to the request of the transmission.

The CPU 111 operates as a transmission application unit by executing the client application 132 using the main memory 121. The CPU 111 operates as a main processing unit by executing the WAN acceleration application 133 using the main memory 121.

The network IF 141 is a communication interface coupled to the WAN and performing data conversion according to communication. The WAN is an example of a network.

FIGS. 5A to 5E are diagrams for illustrating transmission processing according to the embodiment.

An example case where the send data which has not been compressed is transmitted instead of compressed data will be described with reference to FIGS. 5A to 5E.

Figure 5A:
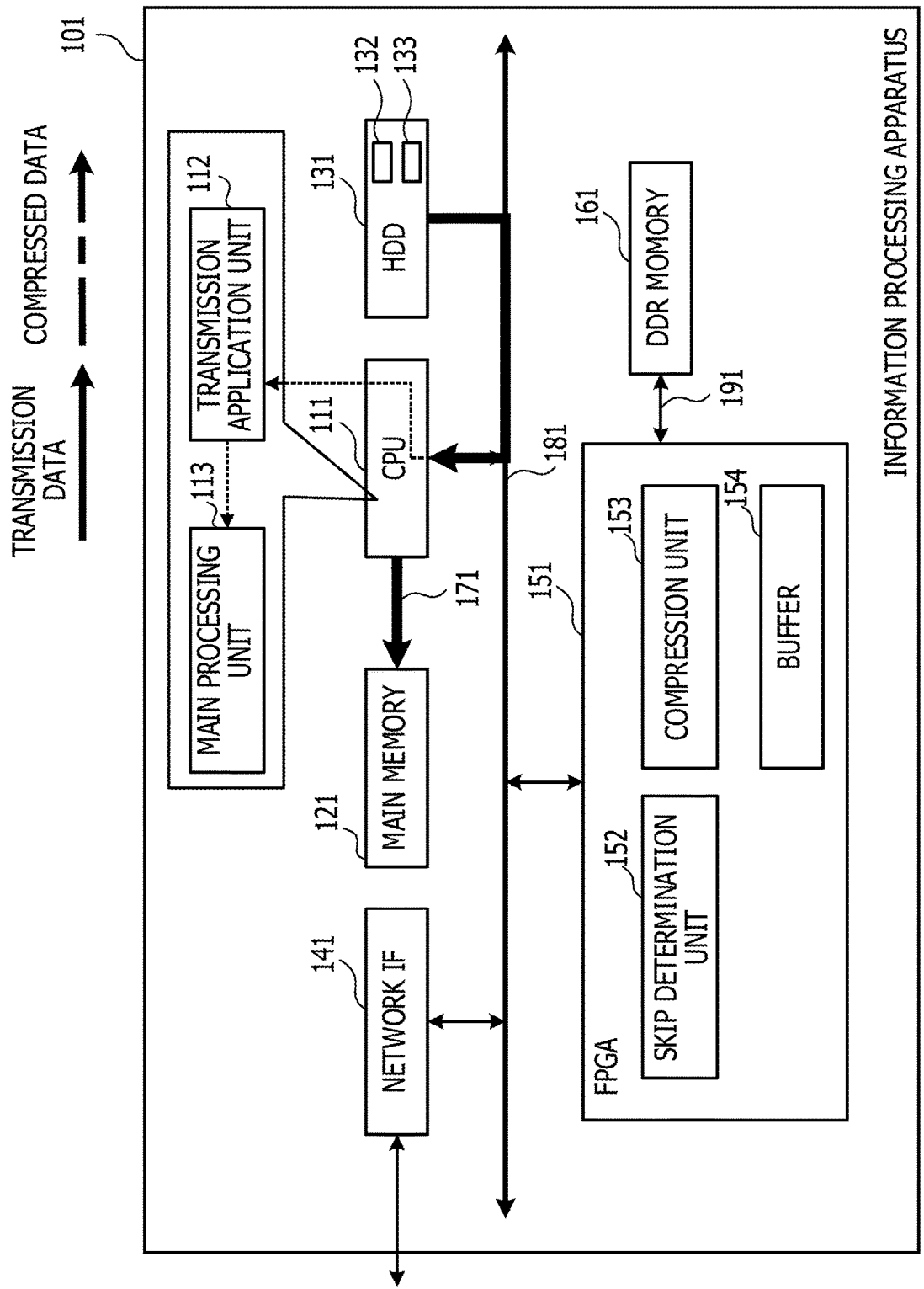
FIG. 5A is a diagram for illustrating transmission processing according to the embodiment.

FIG. 5A: The CPU 111 operates as a transmission application unit 112 by executing the client application 132 and operates as a main processing unit 113 by executing the WAN acceleration application 133. Furthermore, it is assumed that the send data is stored in the HDD 131.

The transmission application unit 112 reads the send data from the HDD 131, and transmits the send data and a transmission request of the send data to the main processing unit 113. The main processing unit 113 transmits the send data to the main memory 121, and stores the send data in the main memory 121.

FIG. 5B: The CPU 111 transmits the send data to the DDR memory 161. In detail, the CPU 111 transmits the send data to the FPGA 151, and the FPGA 151 stores the send data in the DDR memory 161.

Figure 5C:
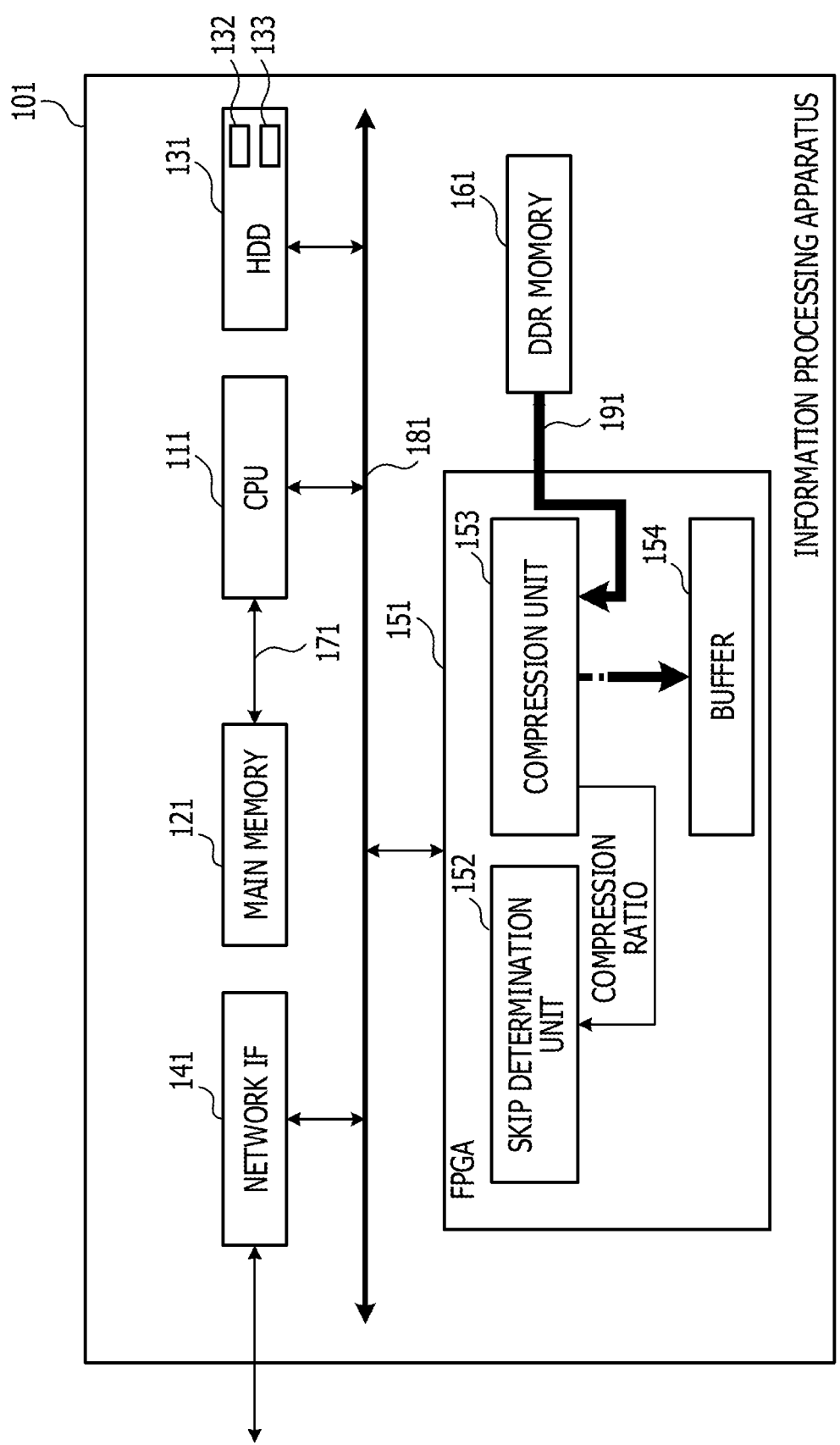
FIG. 5C is a diagram for illustrating the transmission processing according to the embodiment.

FIG. 5C: The compression unit 153 reads the send data from the DDR memory 161, and generates the compressed data by compressing the send data. The compression unit 153 stores the compressed data in the buffer 154. At completion of the compression, the compression unit 153 transmits the compression ratio to the skip determining unit 162.

Figure 5D:
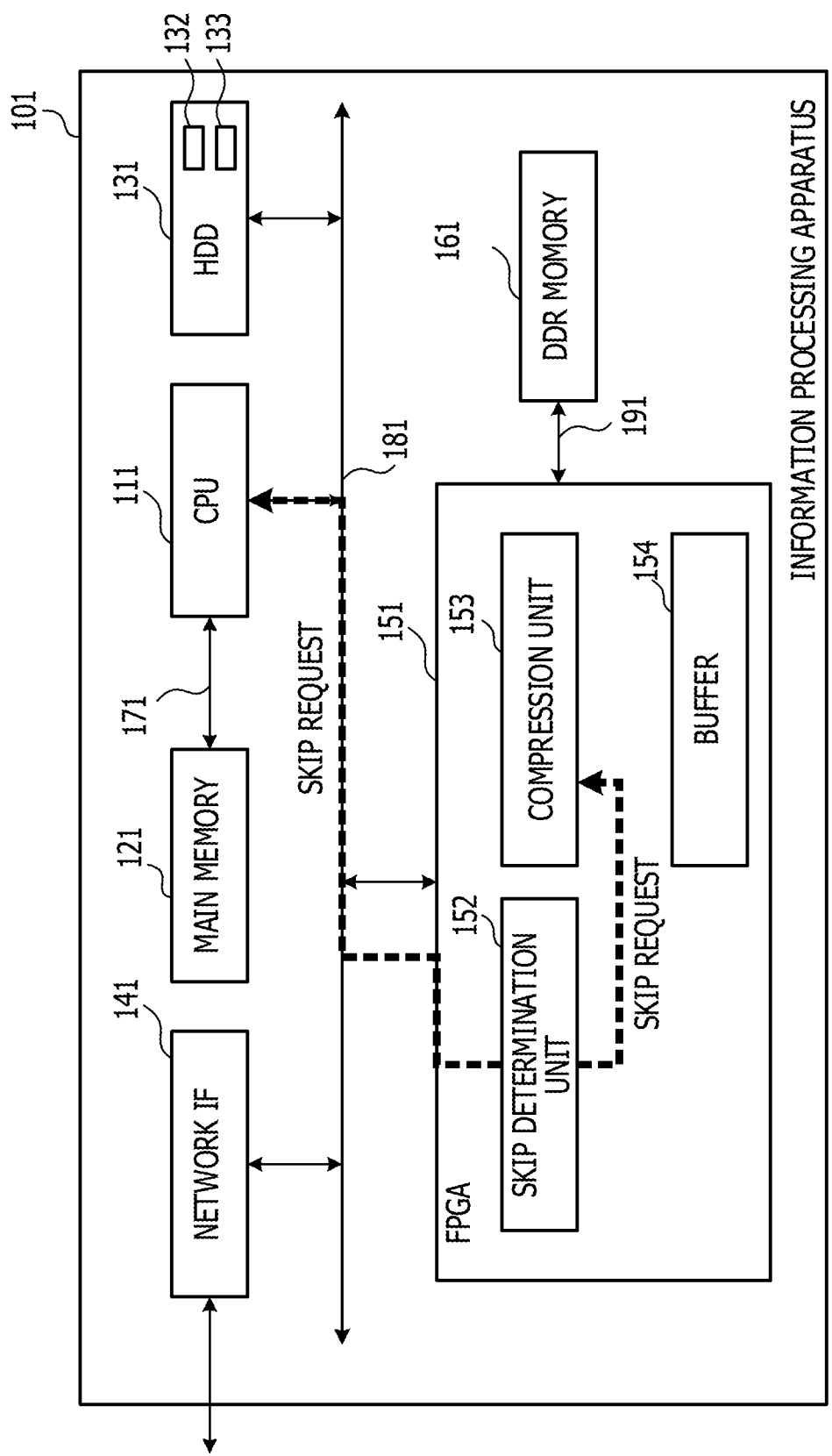
FIG. 5D is a diagram for illustrating the transmission processing according to the embodiment.

FIG. 5D: The skip determining unit 152 determines (skip-determines) send data or the compressed data of it to transmit for each send data based on the compression ratio. Here, the size of compressed send data is not small enough, so that the skip determining unit 152 chooses the original send data. In this case, it is judged that performance is degraded if compressed data is sent. The skip determining unit 152 transmits a skip request to the both CPU 111 and the compression unit 153.

Figure 5E:
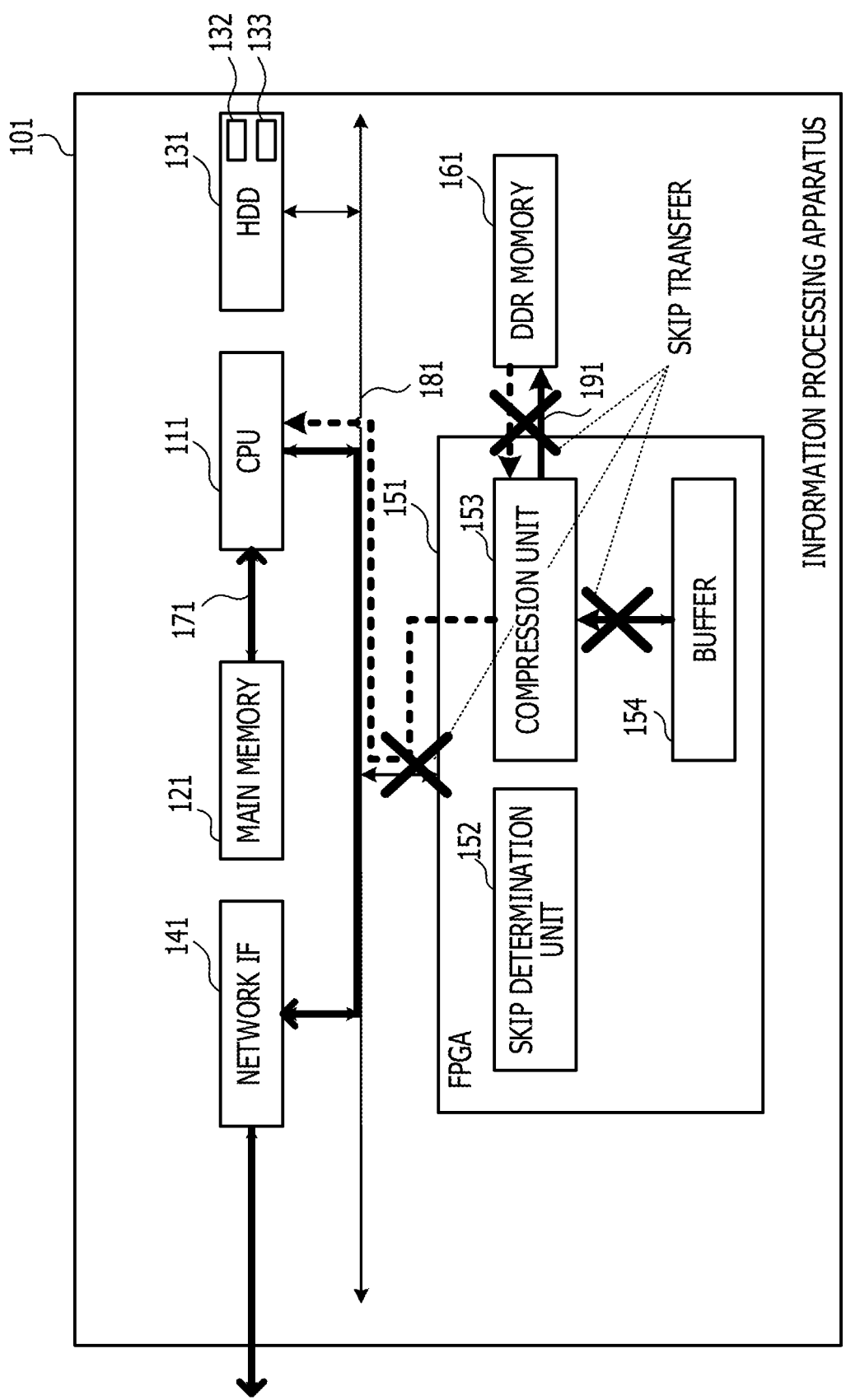
FIG. 5E is a diagram for illustrating the transmission processing according to the embodiment.

FIG. 5E: The FPGA 151 skips remaining processing for the compressed data (sending the compressed data from the DDR memory 161 to the CPU 111). The CPU 111 reads the send data from the main memory 121 and transmits the send data to the network IF 141.

The information processing apparatus 101 according to the embodiment skips sending the compressed data from the DDR memory 161 to the CPU 111 when the performance degradation is predicted, and transmits data before compression from the CPU 111. Accordingly, when hard-to-compress data is input or when bus is temporarily congested, the performance degradation of the information processing apparatus may be prevented. As the transfer of the compressed data from the DDR memory 161 to the CPU 111 is skipped, consumption of the bandwidths of the buses 181 and 191 may be reduced.

FIGS. 6A and 6B are a sequence diagram illustrating the transmission processing when compressed data is transmitted according to the embodiment.

As described above, the CPU 111 operates as a transmission application unit 112 by executing the client application 132 and operates as a main processing unit 113 by executing the WAN acceleration application 133.

In step S501-$i$ ($i$=1 to 3), the transmission application unit 112 reads the send data from the HDD 131, and transmits the send data and a transmission request of the send data to the main processing unit 113. The main processing unit 113 transmits the send data to the main memory 121, and stores the send data in the main memory 121.

In step S502-$i$, the main processing unit 113 transmits the send data to the FPGA 151, and the FPGA 151 stores the send data in the DDR memory 161.

In step S503, the main processing unit 113 transmits a request of compression processing for the send data to the compression unit 153.

In step S504-$i$, the compression unit 153 receives a request of the compression processing, reads the send data from the DDR memory 161, and generates the compressed data by compressing the send data.

In step S505-$i$, the compression unit 153 stores the compressed data in the buffer 154.

In step S506, the compression unit 153 calculates a ratio (hereinafter, referred to as the compression ratio) of the size of the send data and the size of the compressed data. For example, "the compression ratio is obtained by dividing the size of the compression data by the size of the send data". It is indicated that the send data may be compressed to a smaller size if a compression ratio is small. The compression unit 153 transmits, to the skip determining unit 152, an inquiry about whether the compressed data may be used or not and the calculated compression ratio. The skip determining unit 152 determines (skip-determines) send data or the compressed data of it to transmit for each send data based on the compression ratio. Here, it is assumed that it is determined (OK) that the compressed data is transmitted. Furthermore, the compression unit 153 may transmit the size of the send data and the size of the compressed data to the skip determining unit 152, and the skip determining unit 152 may calculate the compression ratio.

In step S507, the skip determining unit 152 transmits "OK" (a compressed data transfer request) indicating that the compressed data is transmitted, to the compression unit 153.

In step S508-$i$, the compression unit 153 transmits an instruction for transmitting the compressed data to the DDR memory 161, to the buffer 154.

In step S509-$i$, the buffer 154 transmits the stored compressed data to the DDR memory 161, and the DDR memory 161 stores the compressed data.

In step S510, the compression unit 153 transmits a processing completion notification to the main processing unit.

In step S511, the main processing unit 113 requests the DDR memory 161 to read the compressed data.

In step S512-$i$, the main processing unit 113 receives the compressed data from the DDR memory 161.

In step S513, the main processing unit 113 transmits the compressed data to the destination device. In detail, the main processing unit 113 transmits the compressed data to the network IF 141. The network IF 141 outputs the compressed data to the WAN coupled thereto.

Figure 7:
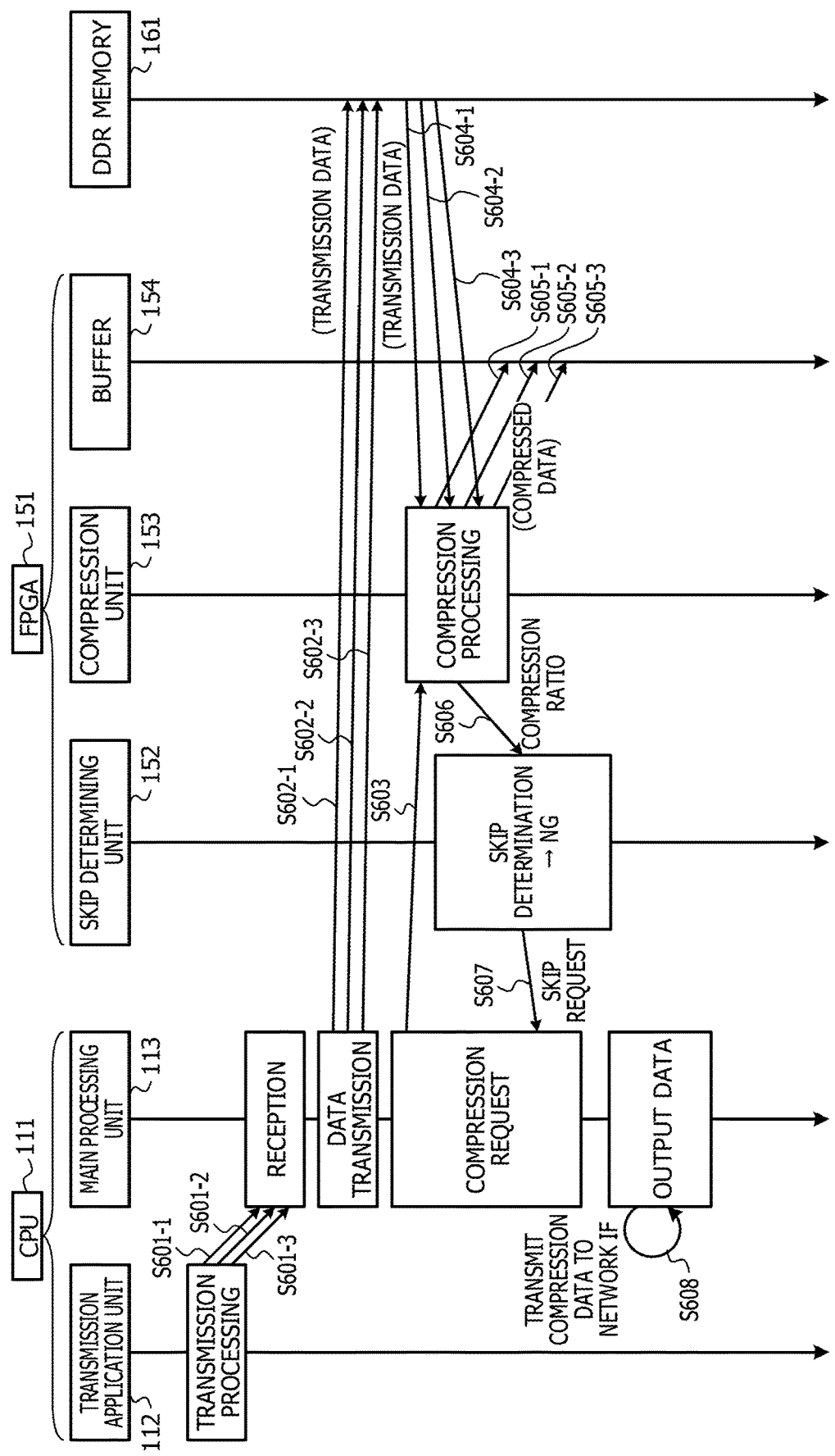
FIG. 7 is a sequence diagram illustrating the transmission processing when the compressed data is not transmitted according to the embodiment.

FIG. 7 is a sequence diagram illustrating the transmission processing when the compressed data is not transmitted according to the embodiment. A case where the compressed data is not transmitted, for example, a case where the send data that has not been compressed is transmitted, will be described with reference to FIG. 7.

In step S601-$i$ ($i$=1 to 3), the transmission application unit 112 reads the send data from the HDD 131, and transmits the send data and a transmission request of the send data to the main processing unit 113. The main processing unit 113 transmits the send data to the main memory 121, and stores the send data in the main memory 121.

In step S602-$i$, the main processing unit 113 transmits the send data to the FPGA 151, and the FPGA 151 stores the send data in the DDR memory 161.

In step S603, the main processing unit 113 transmits a compression request of the send data to the compression unit 153.

In step S604-$i$, the compression unit 153 reads the send data from the DDR memory 161, and generates the compressed data by compressing the send data.

In step S605-$i$, the compression unit 153 stores the compressed data in the buffer 154.

In step S606, the compression unit 153 calculates a ratio (hereinafter, referred to as the compression ratio) of the size of the send data and the size of the compressed data. The compression unit 153 transmits, to the skip determining unit 152, an inquiry about whether the compressed data can be used or not and the calculated compression ratio. The skip determining unit 152 determines (skip-determines) send data or the compressed data of it to transmit for each send data based on the compression ratio. Here, it is assumed that it is determined (NG) that the compressed data is not transmitted. Furthermore, the compression unit 153 may transmit the size of the send data and the size of the compressed data to the skip determining unit 152, and the skip determining unit 152 may calculate the compression ratio.

In step S607, the skip determining unit 152 transmits a skip request to the main processing unit 113. Furthermore, the skip determining unit 152 transmits "NG" indicating that the compressed data is not transmitted, to the compression unit 153 (not illustrated). Instead of the skip determining unit 152, the compression unit 153 may transmit the skip request to the main processing unit 113.

In step S608, the main processing unit 113 transmits the uncompressed send data to the destination device. In detail, the main processing unit 113 reads the send data from the main memory 121 and transmits the send data to the network IF 141. The network IF 141 outputs the send data to the WAN coupled thereto.

Figure 8:
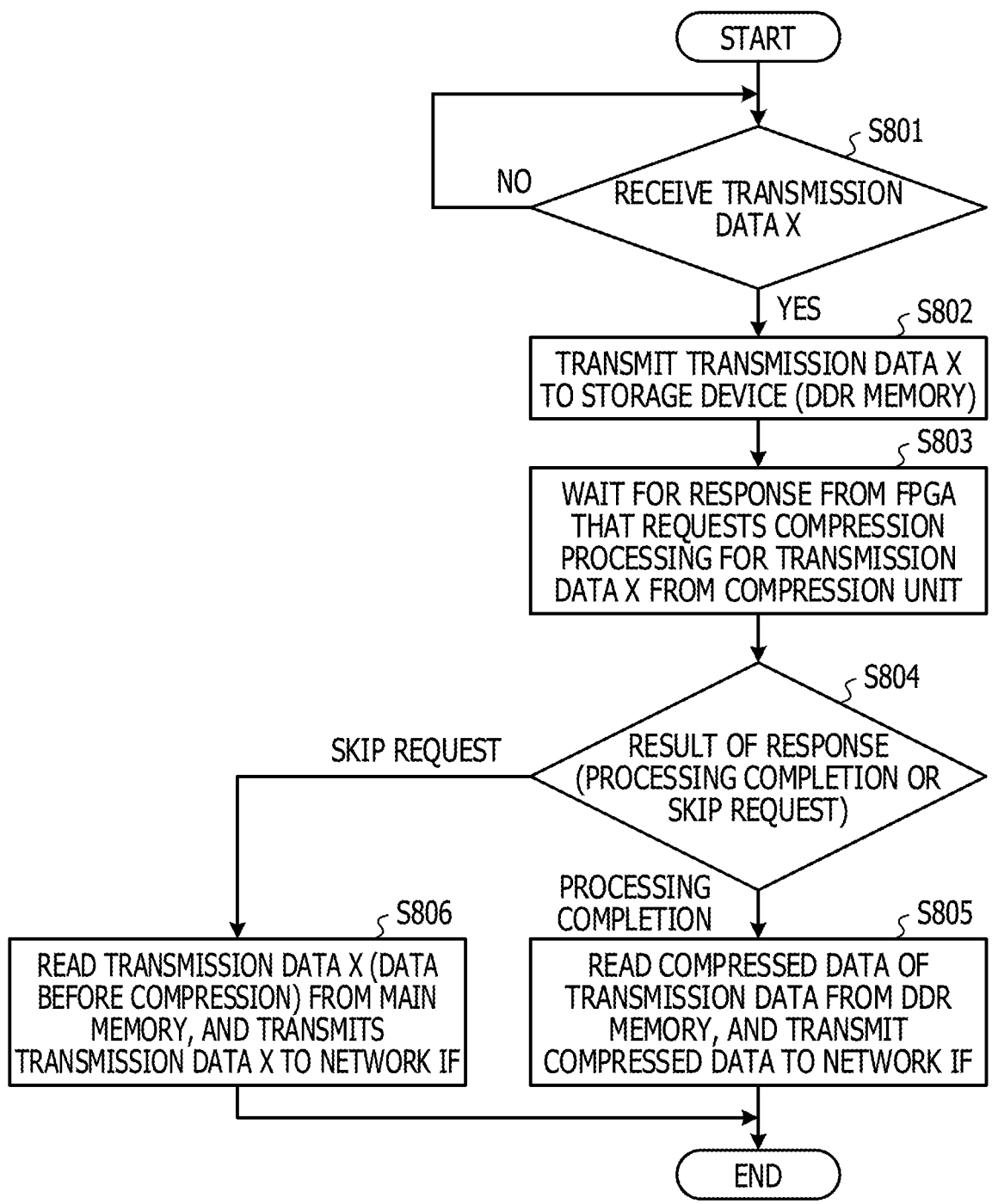
FIG. 8 is a flowchart illustrating processing of a CPU according to the embodiment.

FIG. 8 is a flowchart illustrating processing of a CPU according to the embodiment. FIG. 8 is a flowchart illustrating processing of the main processing unit 113 in detail.

In step S801, the main processing unit 113 receives the send data X from the transmission application unit 112. When the main processing unit 113 receives the send data, the control proceeds to step S802.

In step S802, the main processing unit 113 transmits the send data X to the DDR memory 161.

In step S803, the main processing unit 113 transmits a request of compression processing for the send data X to the compression unit 153. The main processing unit 113 waits for a response from the FPGA 151. When the main processing unit 113 receives the response from the FPGA 151, the control proceeds to step S804.

In step S804, the main processing unit 113 judges whether the received response is the processing completion notification or the skip request. When the received response is the processing completion notification, the control proceeds to step S805, and when the received response is the skip request, the control proceeds to step S806.

In step S805, the main processing unit 113 reads the compressed data obtained by compressing the send data X from the DDR memory 161, and transmits the compressed data to the network IF 141.

In step S806, the main processing unit 113 reads the send data X (data before compression) from the main memory 121, and transmits the send data X to the network IF 141.

Figure 9:
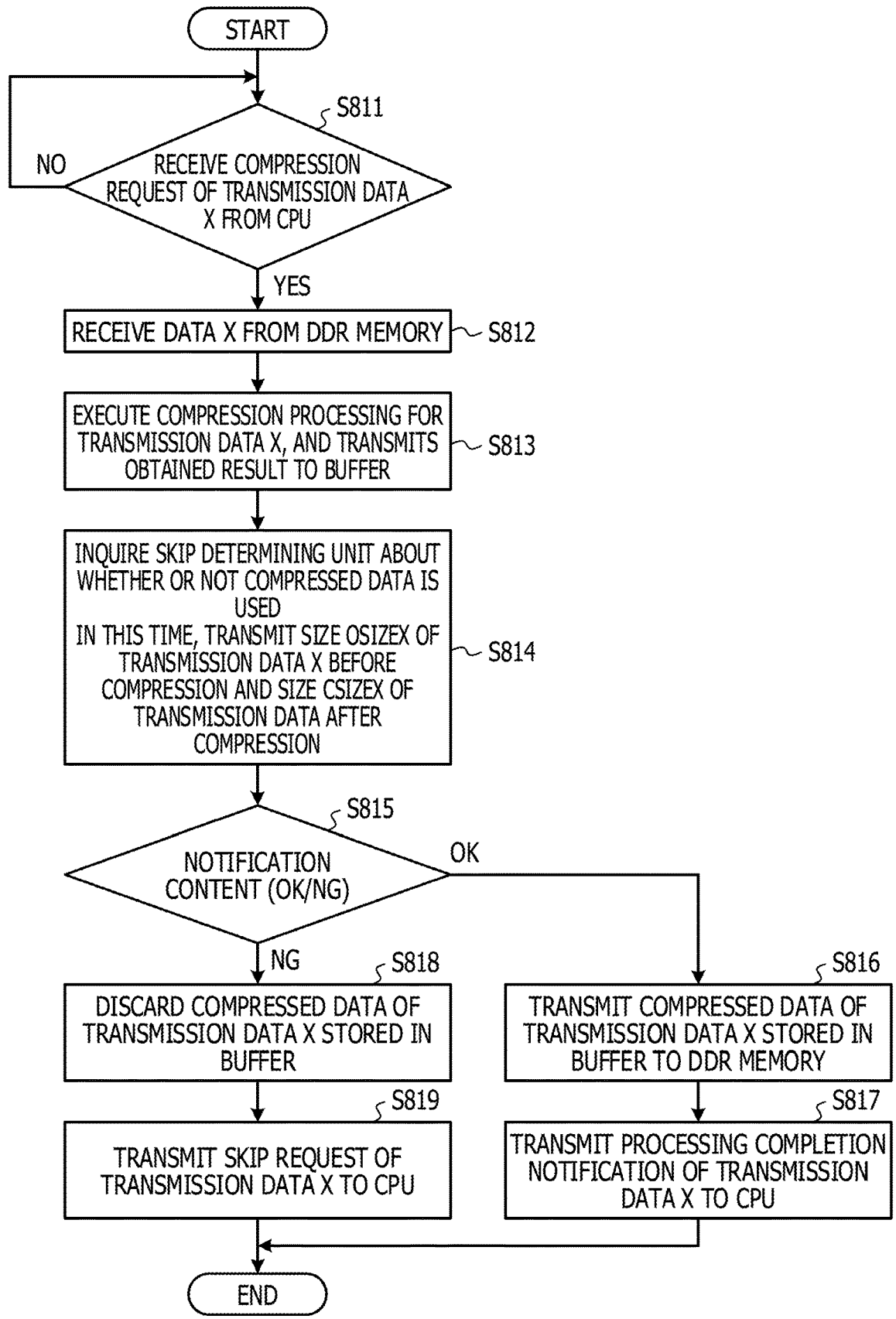
FIG. 9 is a flowchart illustrating processing of a compression unit according to the embodiment.

FIG. 9 is a flowchart illustrating processing of a compression unit according to the embodiment.

In step S811, the compression unit 153 receives the request of the compression processing for the send data X from the main processing unit 113.

In step S812, the compression unit 153 reads the send data X from the DDR memory 161.

In step S813, the compression unit 153 generates the compressed data by compressing the send data X. The compression unit 153 transmits the compressed data to the buffer 153, and stores the compressed data in the buffer 153.

In step S814, the compression unit 153 inquires the skip determining unit 152 about whether or not to use the compressed data. Furthermore, the compression unit 153 transmits the size osizeX of the send data X and the size csizeX of the compressed data together with the inquiry. The compression unit 153 may transmit the compression ratio of the compressed data X.

In step S815, the compression unit 153 receives a notification from the skip determining unit 152, and determines whether the notification is the "OK" indicating that the compressed data is transmitted or the "NG" indicating that the compressed data is not transmitted. When the notification is the "OK", the control proceeds to step S816, and when the notification is the "NG", the control proceeds to step S818.

In step S816, the compression unit 153 transmits, to the DDR memory 161, the compressed data obtained by compressing the send data X stored in the buffer 154.

In step S817, the compression unit 153 transmits the processing completion notification to the main processing unit 113.

In step S818, the compression unit 153 discards the compressed data obtained by compressing the send data X stored in the buffer 154.

In step S819, the compression unit 153 transmits the skip request to the main processing unit 113. Furthermore, when the skip determining unit 152 transmits the skip request to the main processing unit 113, step S819 may be omitted.

Figure 10:
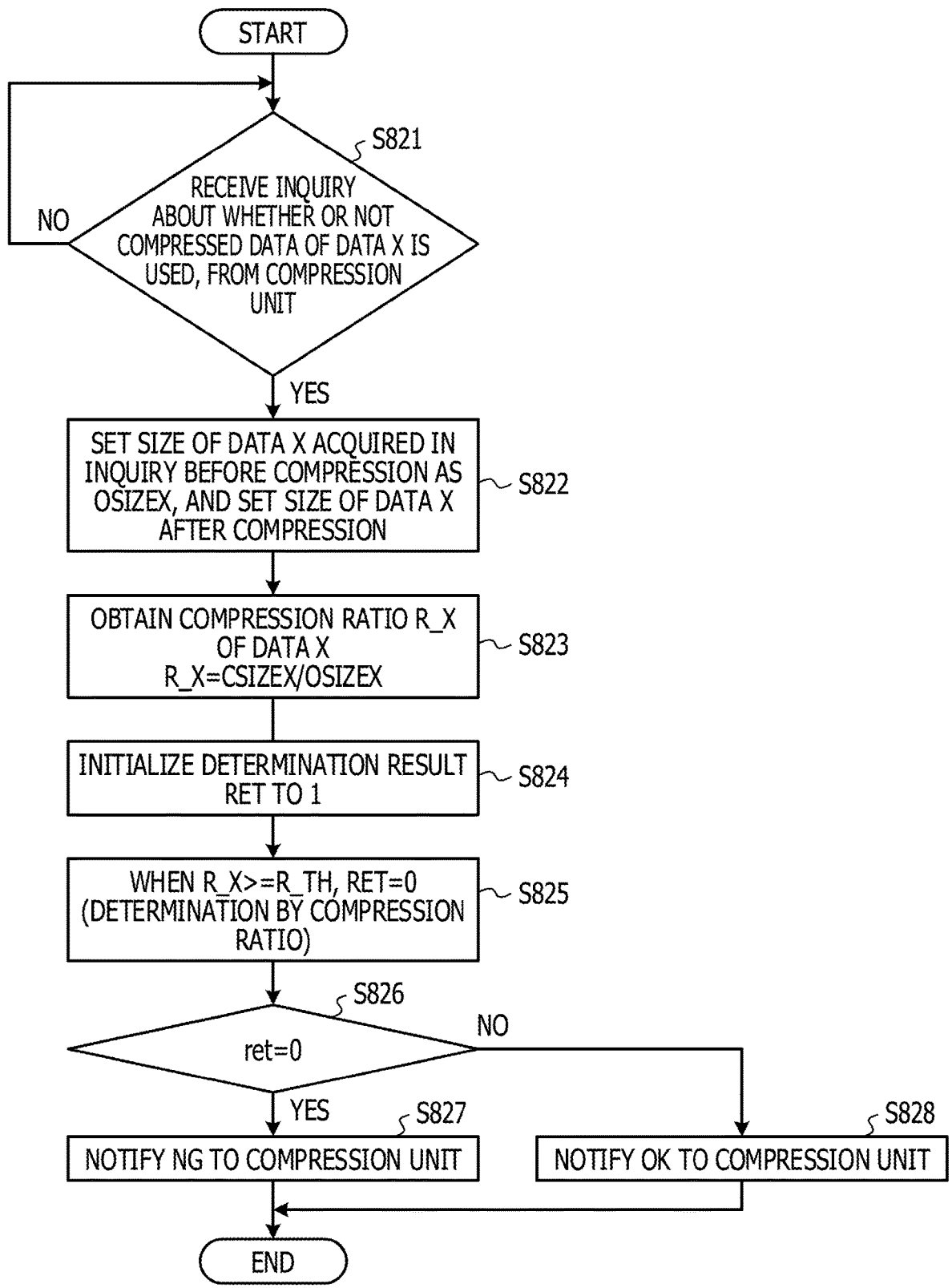
FIG. 10 is a flowchart illustrating processing of a skip determining unit according to the embodiment.

FIG. 10 is a flowchart illustrating processing of a skip determining unit according to the embodiment.

In step S821, the skip determining unit 152 receives, from the compression unit 153, the inquiry about whether or not to use the compressed data. Further, the skip determining unit 152 receives, from the compression unit 153, the size of the send data X and the size of the compressed data. Furthermore, the skip determining unit 152 may receive the compression ratio from the compression unit 153.

In S822, the skip determining unit 152 sets the size of the send data X as osizeX and sets the size of the compressed data as csizeX.

In S823, the skip determining unit 152 calculates a compression ratio R_X of the send data X. The compression ratio R_X is calculated by dividing the size csizeX of the compressed data by the size osizeX of the send data X.

Furthermore, when the skip determining unit 152 receives the compression ratio from the compression unit 153, processing of step S822 and step S823 may be omitted.

In step S824, the skip determining unit 152 initializes a determination result ret, for example, sets the determination result ret to 1.

In step S825, the skip determining unit 152 determines whether the compression ratio R_X is equal to or more than a threshold R_th. When the compression ratio R_X is equal to or more than the threshold R_th, the skip determining unit 152 sets the determination result ret to 0. When the compression ratio R_X is less than the threshold R_th, the determination result ret is kept to be 1.

For example, the threshold R_th is calculated by subtracting, from 1, a value obtained by dividing a WAN speed by an expansion speed. The WAN speed is a speed (a capacity) of a network (the WAN) coupled to the network IF 141. The expansion speed indicates performance of an expansion unit that expands the received compressed data in the transmission destination device for the send data X (or the compressed data). The expansion speed is an output speed of output data (for example, the send data obtained by expanding the compressed data) of the expansion unit. It is assumed that the threshold R_th is predetermined.

For example, when the WAN speed is 10 Gbps and the expansion speed is 40 Gbps, the threshold R_th is 0.75. For example, when the WAN speed is 1 Gbps and the expansion speed is 40 Gbps, the threshold R_th is 0.975. When it is determined based on the compression ratio that the send data is difficult to compress, the compressed data is not transmitted, and loads of the buses 181 and 191 are reduced. Furthermore, as the determination is performed based on the WAN speed and the expansion speed, the determination may be performed in consideration of a transmission speed of the data to the transmission destination.

Further, in step S825, the skip determining unit 152 may set the determination result ret to 0 using the following determination method.

An Embodiment with a Focus on FPGA Side Bus Bandwidth

The skip determining unit 152 records the size of the generated compressed data together with a time-stamp at which the compressed data is generated. When the size of the compressed data generated within the latest one second period is larger than a value obtained by multiplying a velocity of the bus 191 between the FPGA 151 and the DDR memory 161 by 0.6, the skip determining unit 152 sets the determination result ret to 0.

For example, when a speed of the bus 191 between the FPGA 151 and the DDR memory 161 is 64 Gbps (8 GB/s), if the compressed data that is larger than 4.8 GByte is generated in the latest one second, the skip determining unit 152 sets the determination result ret to 0. In this way, when there is little margin in the bus 191, the compressed data is not transmitted, so that performance degradation due to congestion of the bus may be inhibited.

An embodiment with a focus on available capacity of WAN

The skip determining unit 152 records an input rate of data of the information processing apparatus 101 on the transmission side. The input rate of the data is the size of data per predetermined time (for example, one second) that the CPU 111 transmits to the transmission destination through the network IF 141.

For example, when the input rate within the latest one second period is smaller than the WAN speed, the skip determining unit 152 sets the determination result ret to 0. For example, when there is a margin in the bandwidth of the WAN, since it is considered that the compressed data may not be transmitted, the compressed data is not transmitted, and loads of the buses 181 and 191, and the FPGA 151 are reduced.

In step S826, the skip determining unit 152 determines whether or not the determination result ret is 0. When the determination result ret is 0, the control proceeds to step S827, and when the determination result ret is not 0 (for example, the determination result ret=1), the control proceeds to step S828.

In step S827, the skip determining unit 152 transmits, to the compression unit 153, the "NG" indicating that the compressed data is not transmitted.

In step S828, the skip determining unit 152 transmits, to the compression unit 153, the "OK" indicating that the compressed data is transmitted.

According to the information processing apparatus according to the embodiment, performance degradation of the information processing apparatus may be inhibited when data is transmitted.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing apparatus comprising:
a processor; and
a processing circuit coupled to the processor,
the processing circuit is configured to:
generate compressed data by compressing send data; and
determine to transmit either the compressed data or the send data before the compression to a network, based on a size of the compressed data, and
the processor is configured to transmit the compressed data or the send data before the compression to the network, based on a result of the determination,
the processing circuit determines whether the compressed data or the send data before the compression is transmitted to the network, based on the size of the compressed data generated for a predetermined period and a speed of a bus between the memory and the processing circuit.

2. The information processing apparatus of claim 1, wherein the processing circuit stores the compressed data in a memory coupled to the processing circuit, based on the result of the determination.

3. The information processing apparatus of claim 2, wherein the processing circuit stores the compressed data in the memory only when it is determined that the compressed data is transmitted to the network.

4. The information processing apparatus of claim 1, wherein the processing circuit
calculates a ratio of a size of the send data and the size of the compressed data, and
determines whether the compressed data or the send data before the compression is transmitted to the network, based on the ratio.

5. The information processing apparatus of claim 1, wherein the processing circuit transmits the send data before the compression to the network when the size of the compressed data is larger than a value which is calculated based on the speed of the bus.

6. An information processing method comprising:
generating, by a processing circuit, compressed data by compressing send data;
determining, by the processing circuit, to transmit either the compressed data or the send data before the compression to a network, based on a size of the compressed data;
transmitting, by a processor coupled to the processing circuit, the compressed data or the send data before the compression to the network based on a result of the determination,
the processing circuit determines whether the compressed data or the send data before the compression is transmitted to the network, based on the size of the compressed data generated for a predetermined period and a speed of a bus between the memory and the processing circuit.

7. The information processing method of claim 6, wherein the processing circuit stores the compressed data in a memory coupled to the processing circuit, based on the result of the determination.

8. The information processing method of claim 7, wherein the processing circuit stores the compressed data in the memory only when it is determined that the compressed data is transmitted to the network.

9. The information processing method of claim 6, wherein the processing circuit
 calculates a ratio of a size of the send data and the size of the compressed data, and
 determines whether the compressed data or the send data before the compression is transmitted to the network, based on the ratio.

10. The information processing method of claim 6, wherein the send data before the compression is transmitted to the network when the size of the compressed data is larger than a value which is calculated based on the speed of the bus.

11. A non-transitory computer-readable medium recording an information processing program which causes a computer to execute a process, the process comprising:
 generating, by a processing circuit in the computer, compressed data by compressing send data; and
 determining, by the processing circuit, to transmit either the compressed data or the send data before the compression to a network, based on a size of the compressed data;
 transmitting, by a processor coupled to the processing circuit and in the computer, the compressed data or the send data before the compression to the network based on a result of the determination,
 the processing circuit determines whether the compressed data or the send data before the compression is transmitted to the network, based on the size of the compressed data generated for a predetermined period and a speed of a bus between the memory and the processing circuit.

12. The non-transitory computer-readable medium method of claim 11, wherein the processing circuit stores the compressed data in a memory coupled to the processing circuit, based on the result of the determination.

13. The non-transitory computer-readable medium of claim 12, wherein the processing circuit stores the compressed data in the memory only when it is determined that the compressed data is transmitted to the network.

14. The non-transitory computer-readable medium of claim 11, wherein the processing circuit
 calculates a ratio of a size of the send data and the size of the compressed data, and
 determines whether the compressed data or the send data before the compression is transmitted to the network, based on the ratio.

15. The non-transitory computer-readable medium of claim 11, wherein the send data before the compression is transmitted to the network when the size of the compressed data is larger than a value which is calculated based on the speed of the bus.

* * * * *